United States Patent
Corisis et al.

(10) Patent No.: US 6,740,546 B2
(45) Date of Patent: May 25, 2004

(54) PACKAGED MICROELECTRONIC DEVICES AND METHODS FOR ASSEMBLING MICROELECTRONIC DEVICES

(75) Inventors: David J. Corisis, Nampa, ID (US); Mike Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/225,575

(22) Filed: Aug. 21, 2002

(65) Prior Publication Data

US 2004/0038447 A1 Feb. 26, 2004

(51) Int. Cl.⁷ ............................................... H01L 21/44
(52) U.S. Cl. ....................................... 438/126; 438/112
(58) Field of Search ................................ 438/106, 107, 438/108, 110, 112, 121, 124, 125, 126, 127; 174/52.1, 52.2, 52.3, 52.4, 251; 361/748; 29/841, 848, 855; 257/678, 787

(56) References Cited

U.S. PATENT DOCUMENTS

| | | |
|---|---|---|
| 5,128,831 A | 7/1992 | Fox, III et al. |
| 5,518,957 A | 5/1996 | Kim |
| 5,593,927 A | 1/1997 | Farnworth et al. |
| 5,677,566 A | 10/1997 | King et al. |
| 5,696,033 A | 12/1997 | Kinsman |
| 5,739,585 A | 4/1998 | Akram et al. |
| D394,844 S | 6/1998 | Farnworth et al. |
| D402,638 S | 12/1998 | Farnworth et al. |
| 5,851,845 A | 12/1998 | Wood et al. |
| 5,891,753 A | 4/1999 | Akram |
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,020,624 A | 2/2000 | Wood et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,072,233 A | 6/2000 | Corisis et al. |
| 6,072,236 A | 6/2000 | Akram et al. |
| 6,075,288 A | 6/2000 | Akram |
| 6,097,087 A | 8/2000 | Farnworth et al. |
| 6,103,547 A | 8/2000 | Corisis et al. |

(List continued on next page.)

*Primary Examiner*—Evan Pert
*Assistant Examiner*—Scott B. Geyer
(74) *Attorney, Agent, or Firm*—Perkins Coie LLP

(57) ABSTRACT

Packaged microelectronic devices and methods for assembling microelectronic devices are disclosed herein. In one embodiment, a method of assembling a microelectronic device having a die and an interposer substrate includes depositing a solder ball onto a ball-pad on the interposer substrate and molding a compound to form a casing around at least a portion of the die and the solder ball. The method can further include forming a first cover over a first surface of the interposer substrate with the compound and forming a second cover over a second surface opposite the first surface of the interposer substrate with the compound. The first cover can have a first volume and a first surface area and the second cover can have a second volume and a second surface area. The first and second volumes and the first and second surface areas can be at least approximately equal.

48 Claims, 4 Drawing Sheets

U.S. PATENT DOCUMENTS

| | | | |
|---|---|---|---|
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,147,411 A | 11/2000 | Kinsman | |
| 6,150,717 A | 11/2000 | Wood et al. | |
| 6,159,764 A | 12/2000 | Kinsman et al. | |
| 6,172,419 B1 | 1/2001 | Kinsman | |
| 6,175,149 B1 | 1/2001 | Akram | |
| 6,184,465 B1 | 2/2001 | Corisis | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,215,175 B1 | 4/2001 | Kinsman | |
| 6,225,689 B1 | 5/2001 | Moden et al. | |
| 6,228,548 B1 | 5/2001 | King et al. | |
| 6,229,202 B1 | 5/2001 | Corisis | |
| 6,235,554 B1 | 5/2001 | Akram et al. | |
| 6,246,108 B1 | 6/2001 | Corisis et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,482,680 B1 * | 11/2002 | Khor et al. | 438/123 |

* cited by examiner

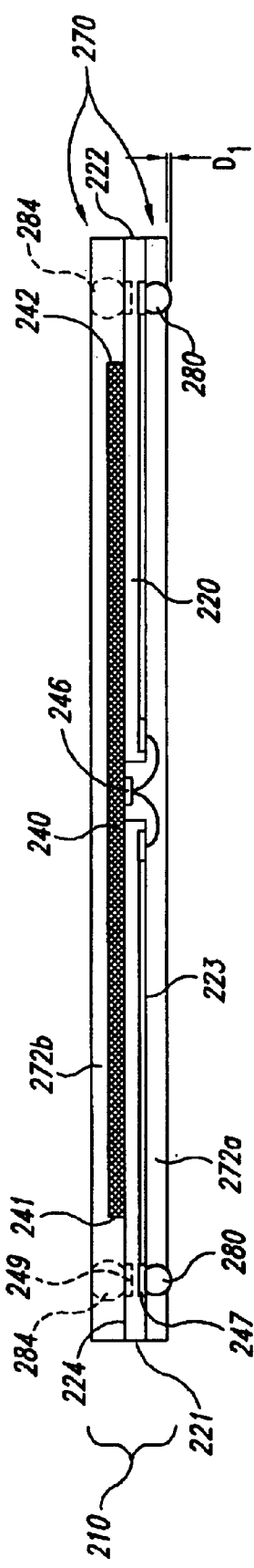
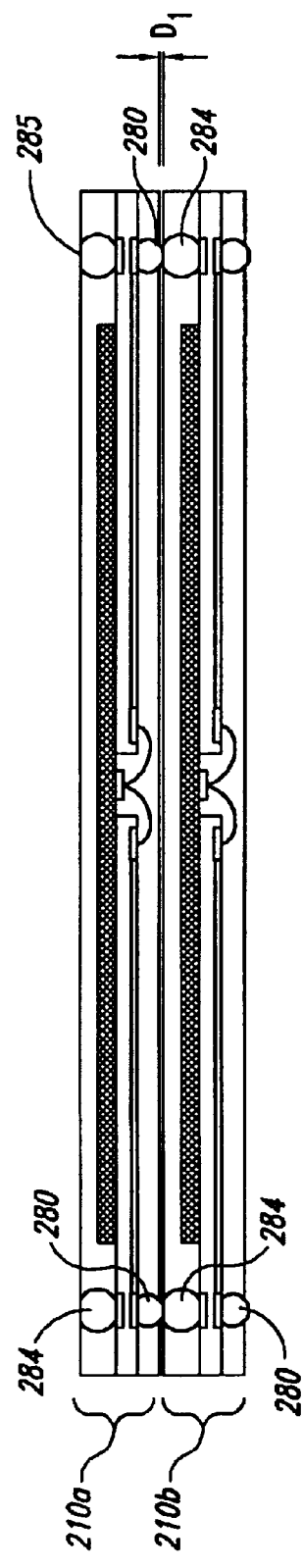

US 6,740,546 B2

PACKAGED MICROELECTRONIC DEVICES AND METHODS FOR ASSEMBLING MICROELECTRONIC DEVICES

TECHNICAL FIELD

The present invention is related to packaged microelectronic devices and methods for assembling microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The dies are then separated from one another (i.e., singulated) by dicing the wafer and backgrinding the individual dies. After the dies have been singulated, they are typically "packaged" to couple the bond-pads to a larger array of electrical terminals that can be more easily coupled to the various power supply lines, signal lines and ground lines.

An individual die can be packaged by electrically coupling the bond-pads on the die to arrays of pins, ball-pads, or other types of electrical terminals, and then encapsulating the die to protect it from environmental factors (e.g., moisture, particulates, static electricity and physical impact). In one application, the bond-pads are electrically connected to contacts on an interposer substrate that has an array of ball-pads. FIG. 1 schematically illustrates a packaged microelectronic device 10 including an interposer substrate 20 and a microelectronic die 40 attached to the interposer substrate 20. The microelectronic die 40 has been encapsulated with a casing 70 to protect the die 40 from environmental factors.

One drawback of encapsulating the microelectronic die 40 is the bowing or warpage of the interposer substrate 20 that occurs after the casing 70 cools. The bowing is caused by the difference between the coefficients of thermal expansion of the interposer substrate 20, the microelectronic die 40, and the casing 70. The warpage of the interposer substrate 20 can create sufficient stress to cause failure in the solder links between the interposer substrate 20 and a printed circuit board to which the interposer substrate 20 is attached. Accordingly, there is a need to reduce and/or eliminate the warpage in the microelectronic device 10.

Moreover, electronic products require packaged microelectronic devices to have an extremely high density of components in a very limited space. For example, the space available for memory devices, processors, displays and other microelectronic components is quite limited in cell phones, PDAs, portable computers and many other products. As such, there is a strong drive to reduce the height of the packaged microelectronic device 10 and the surface area or "footprint" of the microelectronic device 10 on a printed circuit board. Reducing the size of the microelectronic device 10 is difficult because high performance microelectronic devices 10 generally have more bond-pads, which result in larger ball-grid arrays and thus larger footprints. One technique used to increase the density of microelectronic devices 10 within a given footprint is to stack one microelectronic device 10 on top of another.

FIG. 2 schematically illustrates the packaged microelectronic device (identified as 10a) of FIG. 1 stacked on top of a second similar microelectronic device 10b. The interposer substrate 20 of the first microelectronic device 10a is coupled to the interposer substrate 20 of the second microelectronic device 10b by large solder balls 80. The large solder balls 80 required to span the distance between the two interposer substrates 20 use valuable space on the interposer substrates 20, and thus increase the footprint of the microelectronic devices 10. Accordingly, there is a need to reduce the footprints of stacked microelectronic devices 10.

SUMMARY

The present invention is directed to packaged microelectronic devices and methods for assembling microelectronic devices. One aspect of the invention is directed to a method of packaging a microelectronic device including a die having an integrated circuit and an interposer substrate having a ball-pad electrically coupled to the integrated circuit. In one embodiment, the method includes depositing a solder ball onto the ball-pad and molding a compound to form a casing around at least a portion of the die and at least a portion of the solder ball. In a further aspect of this embodiment, the method can further include forming a first cover over a first surface of the interposer substrate with the compound and forming a second cover over a second surface opposite the first surface of the interposer substrate with the compound. The first cover can have a first volume and the second cover can have a second volume at least approximately equal to the first volume. In another aspect of this embodiment, the first cover can have a first surface area and the second cover can have a second surface area at least approximately equal to the first surface area.

In another embodiment of the invention, the method includes placing the solder ball onto the ball-pad and encapsulating the die and the first and second surfaces of the interposer substrate to form the first cover over the first surface and the second cover over the second surface. In a further aspect of this embodiment, the first cover can have a first surface area and the second cover can have a second surface area at least approximately equal to the first surface area. In another aspect of this embodiment, the first cover can have a first volume and the second cover can have a second volume at least approximately equal to the first volume. In further aspect of this embodiment, placing the solder ball occurs before encapsulating the die and the first and second surfaces.

In another embodiment of the invention, a packaged microelectronic device includes a microelectronic die having an integrated circuit and a bond-pad coupled to the integrated circuit and an interposer substrate coupled to the die. The interposer substrate has a first surface, a second surface opposite the first surface, and a ball-pad electrically coupled to the bond-pad on the die. The microelectronic device also includes a solder ball on the ball-pad and a casing covering the die, at least a portion of the first surface, and at least a portion of the second surface. In a further aspect of this embodiment, the casing can cover at least a portion of the solder ball. In another aspect of this embodiment, the casing includes a first cover and a second cover. The first cover has a first surface area and a first volume, and the second cover has a second surface area and a second volume. The first surface area can be at least approximately equal to the second surface area, and the first volume can be at least approximately equal to the second volume.

BRIEF DESCRIPTION OF THE DRAWINGS

FIG. 4 is a schematic cross-sectional view of a microelectronic device having an interposer substrate and a microelectronic die in accordance with an embodiment of the invention.

FIG. 5 is a schematic cross-sectional view of the packaged microelectronic device of FIG. 4 stacked on top of a second similar microelectronic device in accordance with yet another embodiment of the invention.

DETAILED DESCRIPTION

The following description is directed toward packaged microelectronic devices and methods for manufacturing packaged microelectronic devices. Many specific details of several embodiments are described below with reference to packaged microelectronic devices having microelectronic dies and interposer substrates to provide a thorough understanding of such embodiments. The present invention, however, can be practiced using other types of microelectronic devices and/or micromechanical devices. Those of ordinary skill in the art will thus understand that the invention may have additional embodiments, or that the invention may be practiced without several of the details described in this section.

A. Environment

Figure 1:
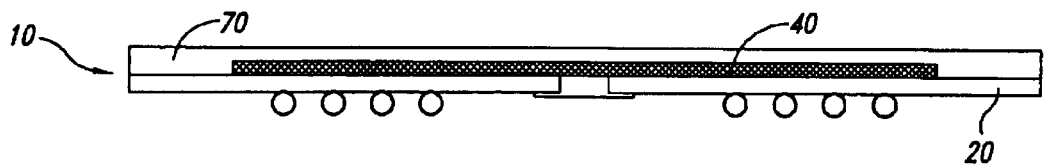
FIG. 1 is a schematic cross-sectional view of a packaged microelectronic device including an interposer substrate and a microelectronic die in accordance with the prior art.
Figure 2:
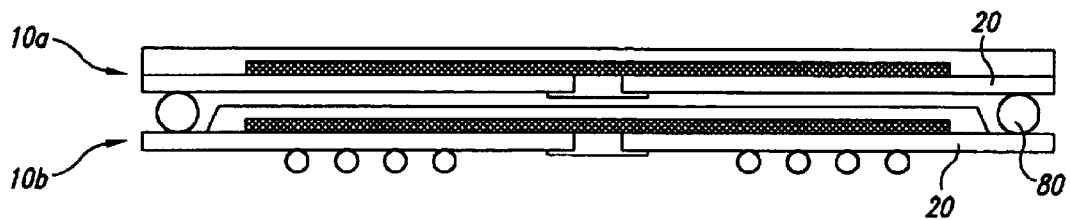
FIG. 2 is a schematic cross-sectional view of the packaged microelectronic device of FIG. 1 stacked on top of a second similar microelectronic device in accordance with the prior art.
Figure 3:
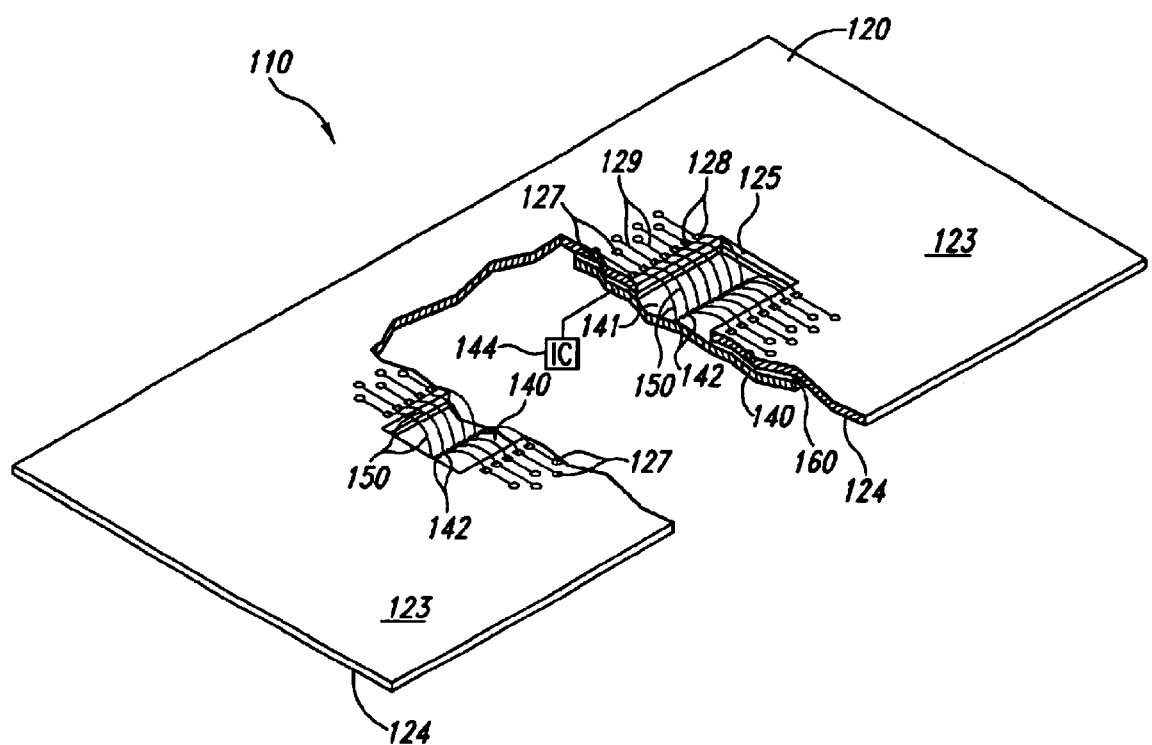
FIG. 3 is a top cutaway isometric view of a microelectronic device that is to be encapsulated using a method in accordance with one embodiment of the invention.

FIG. 3 is a top cutaway isometric view of a microelectronic device 110 that is to be encapsulated using a method in accordance with one embodiment of the invention. The microelectronic device 110 includes an interposer substrate 120 and a microelectronic die 140 attached to the interposer substrate 120 by an adhesive 160. The microelectronic device 110 shown in FIG. 3 illustrates the interposer substrate 120 and the microelectronic die 140 before encapsulating the die 140 with a mold compound.

In the illustrated embodiment, the interposer substrate 120 has a first surface 123, a second surface 124 opposite the first surface 123, and an elongated slot 125 between the first and second surfaces 123 and 124 that extends lengthwise along a medial portion of the interposer substrate 120. The interposer substrate 120 is generally an interposing device that provides an array of ballads for coupling very small contacts on the microelectronic die 140 to another type of device. In the embodiment shown in FIG. 3, the interposer substrate 120 includes a first array of ball-pads 127, a second array of terminal pads 128 proximate to the slot 125, and a trace 129 or other type of conductive line between each ball-pad 127 and a corresponding terminal pad 128. The interposer substrate 120 can be a flexible material or a substantially rigid material, and the traces 129 can be conductive lines that are printed on the substrate 120 in a manner similar to printed circuit boards.

The embodiment of the microelectronic die 140 shown in FIG. 3 includes a first side 141 attached to the second surface 124 of the interposer substrate 120 by the adhesive 160. The microelectronic die 140 also includes a plurality of small bond-pads 142 and an integrated circuit 144 (shown schematically) coupled to the bond-pads 142. The bond-pads 142 are arranged in an array along the first side 141 of the microelectronic die 140 so that the bond-pads 142 are aligned with or otherwise accessible through the slot 125 in the interposer substrate 120. A plurality of wire-bonds or other types of connectors 150 couple the bond-pads 142 of the die 140 to corresponding terminal pads 128 on the interposer substrate 120. As such, the interposer substrate 120 distributes the very small bond-pads 142 to the larger array of ball-pads 127.

B. Packaged Microelectronic Devices

FIG. 4 is a schematic cross-sectional view of a microelectronic device 210 having an interposer substrate 220 and a microelectronic die 240 coupled to the interposer substrate 220 in accordance with one embodiment of the invention. The interposer substrate 220 and the microelectronic die 240 can be similar to the interposer substrate 120 and microelectronic die 140 discussed above with reference to FIG. 3. The interposer substrate 220, for example, includes a first surface 223, a second surface 224 opposite the first surface 223, a first end 221, and a second end 222 opposite the first end 221. The microelectronic die 240 includes a first end 241 and a second end 242 opposite the first end 241. The microelectronic die 240 can also include bond-pads 246 that are electrically coupled to first ball-pads 247 on, the first surface 223 of the interposer substrate 220 and/or second ball-pads 249 (shown in broken lines) on the second surface 224 of the interposer substrate 220. In other embodiments, the interposer substrate 220 may have only the first ball-pads 247, and the bond-pads 246 are thus coupled to only the first ball-pads 247 in such other embodiments.

The microelectronic device 210 of the illustrated embodiment also includes a casing 270 encapsulating the microelectronic die 240, the first surface 223 of the interposer substrate 220, and the second surface 224 of the interposer substrate 220. The casing 270 can include a first cover 272a over the first surface 223 of the interposer substrate 220 and a second cover 272b over the microelectronic die 240 and the second surface 224 of the interposer substrate 220. The first cover 272a and the second cover 272b can have at least approximately the same volume. Furthermore, the first cover 272a can cover a first surface area on the first surface 223 and the second cover 272b can cover a second surface area on the second surface 224 that is at least approximately equal to the first surface area. The first and second covers 272a and 272b can extend on each side of the interposer substrate 220 from at least proximate to the first end 221 to at least proximate to the second end 222. In other embodiments, the casing 270 may not cover the entire first and second surfaces 223 and 224 of the interposer substrate 220.

The microelectronic device 210 of the illustrated embodiment also includes first encased solder balls 280 attached to first ballads 247 proximate to the first surface 223 of the interposer substrate 220. The first encased solder balls 280 and the first ball-pads 247 are positioned either between the first end 241 of the microelectronic die 240 and the first end 221 of the interposer substrate 220 or the second end 242 of the microelectronic die 240 and the second end 222 of the interposer substrate 220 in the illustrated embodiment. The microelectronic device 210 can also include second encased solder balls 284 (shown in broken lines) attached to second ball-pads 249 (shown in broken lines) proximate to the second surface 224 of the interposer substrate 220. Each second encased solder ball 284 is attached to the interposer substrate 220 approximately opposite a corresponding first encased solder ball 280 in the embodiment of FIG. 4 such that the first and second: encased solder balls 280 and 284 are positioned approximately the same distance from the first and second ends 221 and 222 of the interposer substrate 220. In other embodiments, however, the first and second encased solder balls 280 and 284 may not be opposite each other. In the illustrated embodiment, the first encased solder balls 280 are electrically coupled to the microelectronic die 240. In another embodiment, the second encased solder balls 284 can be electrically coupled to the die 240, and/or the first and second encased solder balls 280 and 284 can be electrically coupled to each other with pass-through circuitry.

In the illustrated embodiment, the first encased solder balls 280 project beyond the first cover 272a by a distance $D_1$. In other embodiments, such as the embodiments described below with reference to FIGS. 6 and 7, the first encased solder balls 280 may not project beyond the first cover 272a. In additional embodiments, the microelectronic device 210 may not include second encased solder balls 284, or it may include second encased solder balls 284 that project beyond the second cover 272b. In still other embodiments, the microelectronic device 210 can include additional ball-pads and solder balls across the first and/or second surfaces 223 and 224 of the interposer substrate 220, such as described below with reference to FIG. 8.

The microelectronic device 210 of the illustrated embodiment, can be manufactured by attaching at least one set of the first and second encased solder balls 280 and 284 to the interposer substrate 220. Next, the interposer, substrate 220, the microelectronic die 240, and at least portions of the first and second encased solder balls 280 and 284 are encapsulated. In one embodiment, the interposer substrate 220, the microelectronic die 240, and the first and second encased solder balls 280 and 284 are positioned in a mold for encapsulation. The mold can include a liner, such as a non-stick tape or non-stick film. The first encased solder balls 280 are pressed partially into the liner as the mold clamps to the interposer substrate 220. The liner prevents the molding compound from covering the entire first encased solder balls 280. Accordingly, the portion of the first encased solder balls 280 that is pressed into the liner is the portion that projects beyond the first cover 272a. Once the interposer substrate 220, the microelectronic die 240, and the first and second encased solder balls 280 and 284 are positioned in the mold, a molding compound is injected into the mold and formed around the interposer substrate 220, the microelectronic die 240, and the first and second encased solder balls 280 and 284. In other embodiments, the interposer substrate 220, the microelectronic die 240, and the first and second encased solder balls 280 and 284 can be encapsulated using other methods.

One advantage of the embodiment illustrated in FIG. 4 is that the approximately equal volumes and/or surface areas of the first and second covers 272a and 272b eliminate the warping and bowing of the microelectronic device 210. The stresses that cause warping can occur when the microelectronic device 210 cools after encapsulation. The stresses occur because the interposer substrate 220, the microelectronic die 240, and the first and second covers 272a and 272b have different coefficients of thermal expansion. The thermal stresses do not cause warping in the embodiment illustrated in FIG. 4 because the stress on one side of the microelectronic device 210 offsets the stress on the other side due to the approximately equal volumes and/or surface areas of the first and second covers 272a and 272b.

FIG. 5 is a schematic cross-sectional view of the microelectronic device (identified as 210a) of FIG. 4 stacked on top of a second similar microelectronic device 210b in accordance with another embodiment of the invention. The first microelectronic device 210a is coupled to the second microelectronic device 210b by attaching the first encased solder balls 280 of the first microelectronic device 210a to a generally flat surface 285 on the second encased solder balls 284 of the second microelectronic device 210b. In one embodiment, the generally flat surface 285 can be formed by grinding the second encased solder balls 284. In another embodiment, the generally flat surface 285 can be formed by the mold during encapsulation. In this embodiment, the mold may not contain the liner discussed above with reference to FIG. 4, or the liner may not be compressible. Accordingly, the mold flattens a portion of the second encased solder balls 284 forming the flat surface 285. In the illustrated embodiment, the first microelectronic device 210a is spaced apart from the second microelectronic device 210b by the distance $D_1$. In other embodiments, the microelectronic devices 210 can be coupled to other devices, such as printed circuit boards.

One advantage of the embodiment illustrated in FIG. 5 is that the size of the encased solder balls 280 and 284 used to couple the first and second microelectronic devices 210a and 210b can be reduced. By using two solder balls rather than one solder ball to span the distance between the microelectronic devices, each solder ball can have a smaller diameter. Solder balls with smaller diameters use less space on the interposer substrate. Consequently, the size of the interposer substrate can be reduced, thereby decreasing the footprint of the interposer substrate on a printed circuit board.

Figure 6:
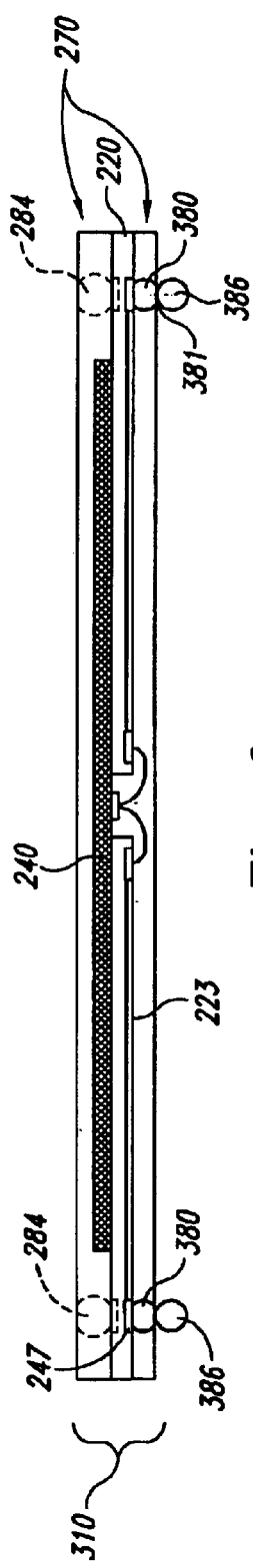
FIG. 6 is a schematic cross-sectional view of a microelectronic device in accordance with still another embodiment of the invention.

FIG. 6 is a schematic cross-sectional view of a microelectronic device 310 in accordance with another embodiment of the invention. The microelectronic device 310 can include the interposer substrate 220, the microelectronic die 240, the casing 270, and the second encased solder balls 284 (shown in broken lines) described above. The microelectronic device 310 also includes first encased solder balls 380 attached to the first ball-pads 247 proximate to the first surface 223 of the interposer substrate 220. Each first encased solder ball 380 can have a generally flat surface 381 opposite the interposer substrate 220. In one embodiment, the flat surface 381 of the first encased solder balls 380 can be formed by grinding the first encased solder balls 280 described above with reference to FIG. 4. In additional embodiments, the generally flat surface 381 can be formed in the molding process as discussed above with reference to FIG. 5. The microelectronic device 310 further includes exterior solder balls 386 attached to the generally flat surface 381 of the first encased solder balls 380.

Figure 7:
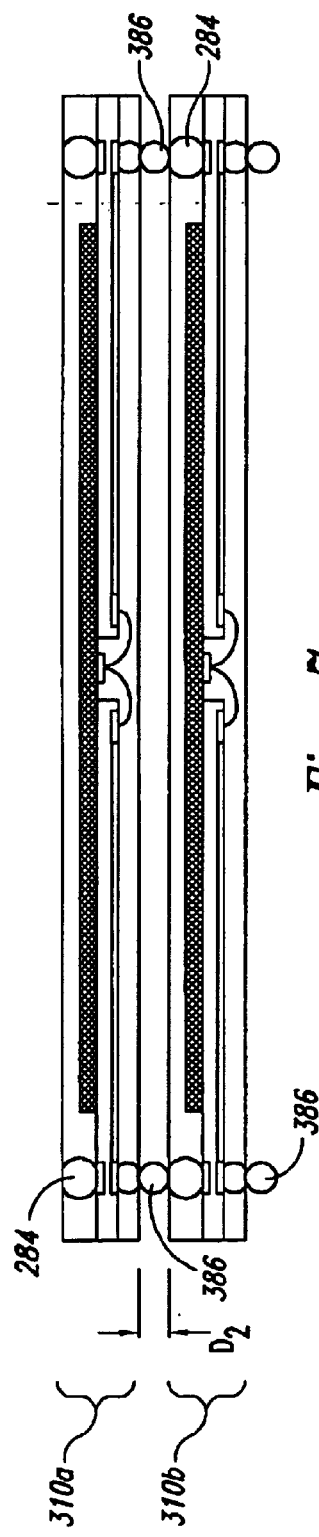
FIG. 7 is a schematic cross-sectional view of the packaged microelectronic device of FIG. 6 stacked on top of a second similar microelectronic device in accordance with yet another embodiment of the invention.

FIG. 7 is a schematic cross-sectional view of the microelectronic device (identified as 310a) of FIG. 6 stacked on top of a second similar microelectronic device 310b in accordance with another embodiment of the invention. The first microelectronic device 310a can be coupled to the second microelectronic device 310b by attaching the exterior solder balls 386 to the second encased solder balls 284. Accordingly, the size of the exterior solder balls 386 determines the distance $D_2$ between the first and second microelectronic devices 310a and 310b.

Figure 8:
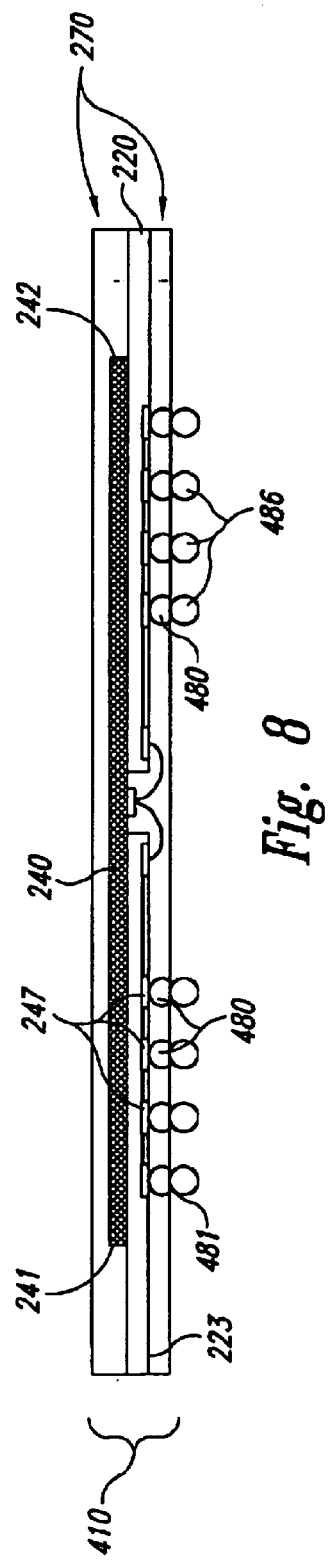
FIG. 8 is, a schematic cross-sectional view of a microelectronic device in accordance with still another embodiment of the invention.

FIG. 8 is a schematic cross-sectional view of a microelectronic device 410 in accordance with another embodiment of the invention. The microelectronic device 410 of the illustrated embodiment includes the interposer substrate 220, the microelectronic die 240, and the casing 270 described above. The microelectronic device 410 also includes first encased solder balls 480 attached to the first, ball-pads 247 proximate to the first surface 223 of the interposer substrate 220. The first encased solder balls 480 can be arranged between the first end 241 and the second end 242 of the microelectronic die 240. In the illustrated embodiment, each of the first encased solder balls 480 has a flat surface 481 opposite the first surface 223 of the interposer substrate 220. The flat surface 481 can be formed by grounding and/or molding as discussed above with reference to FIG. 6. After the microelectronic device 410 is encapsulated with the casing 270, exterior solder balls 486 can be attached to the first encased solder balls 480. Accordingly, each exterior solder ball 486 is attached to the flat surface 481 of a corresponding first encased solder ball 480. In other embodiments, the microelectronic device 410 may not include the exterior solder balls 486. In additional embodiments, the microelectronic device 410 can include additional ball-pads and solder balls to permit coupling and/or stacking, such as described above with reference to FIGS. 4–7.

From the foregoing it will be appreciated that the embodiments of the invention described above provide the best mode of the invention and provide sufficient disclosure to enable a person skilled in the art to make and use these embodiments, but that modifications may be made to these embodiments that add or delete features without deviating from the spirit and scope of the invention. Therefore, the scope of the invention is not limited except as defined only by the claims that follow.

What is claimed is:

1. A method of assembling a microelectronic device having a die including a bond-pad and dielectric interposer substrate including a ball-pad electrically coupled to the bond-pad on the die, the method comprising:

placing a solder ball onto the ball-pad; and encapsulating a first side and a second side opposite the first side of the microelectronic device with a casing after placing the solder ball onto the ball-pad, wherein the casing covers at least a portion of the solder ball, and wherein the first and second sides are covered with at least approximately equal portions of the casing.

2. The method of claim 1 wherein the solder ball is an encased solder ball, and wherein the method further comprises:

grinding the encased solder ball; and depositing an exterior solder ball onto a ground surface of the encased solder ball.

3. The method of claim 1 wherein the microelectronic device is a first microelectronic device, wherein the solder ball is an encased solder ball, and wherein the method further comprises:

grinding the encased solder ball;

depositing an exterior solder ball onto a ground surface of the encased solder ball; and attaching a second microelectronic device to the exterior solder ball so that the first and second microelectronic devices are stacked.

4. The method of claim 1 wherein the microelectronic device is a first microelectronic device, and wherein the method further comprises coupling a second microelectronic device to the solder ball so that the first and second microelectronic devices are stacked.

5. The method of claim 1 wherein the solder ball is an encased solder ball, and wherein the method further comprises depositing an exterior solder ball onto the encased solder ball.

6. The method of claim 1 wherein the microelectronic device is a first microelectronic device, wherein the solder ball is an encased solder ball, and wherein the method further comprises:

depositing an exterior solder ball onto the encased solder ball; and coupling a second microelectronic device to the exterior solder ball so that the first and second microelectronic devices are stacked.

7. The method of claim 1 wherein:

the solder ball is a first solder ball and the ball-pad is a first ball-pad;

the method further comprises placing a second solder ball onto a second ball-pad on the dielectric interposer substrate before encapsulating; and encapsulating the device further comprises encasing at least a portion of the second solder ball with the casing.

8. The method of claim 1 wherein:

the solder ball is a first solder ball and the ball-pad is a first ball-pad on a first surface of the dielectric interposer substrate;

the method further comprises placing a second solder ball onto a second ball-pad on a second surface of the dielectric interposer substrate opposite the first surface before encapsulating; and encapsulating the device further comprises encasing at least a portion of the second solder ball with the casing.

9. The method of claim 1 wherein encapsulating the first side and the second side comprises:

positioning the die, the dielectric interposer substrate, and the solder ball in a mold cavity; and injecting mold compound into the mold cavity.

10. The method of claim 1 wherein encapsulating the first side and the second side comprises:

positioning the die, the dielectric interposer substrate, and the solder ball in a mold cavity;

pressing at least a portion of the solder ball into a liner in at least a portion of the mold cavity; and injecting mold compound into the mold cavity.

11. The method of claim 1 wherein the die has a first end and a second end opposite the first end, and wherein placing the solder ball onto the ball-pad comprises placing the solder ball onto the ball-pad between the first end and the second end of the die.

12. The method of claim 1 wherein the dielectric interposer substrate has an end, and wherein placing the solder ball onto the ball-pad comprises placing the solder ball onto the ball-pad between the die and the end of the dielectric interposer substrate.

13. The method of claim 1 wherein the casing on the first side of the microelectronic device has a first volume and the casing on the second side has a second volume at least approximately equal to the first volume.

14. The method of claim 1 wherein the casing covers a first surface area on the first side of the microelectronic device and a second surface area on the second side at least approximately equal to the first surface area.

15. A method of packaging a microelectronic device including a die having an integrated circuit and dielectric interposer substrate having a ball-pad electrically coupled to the integrated circuit, the method comprising:

depositing a solder ball onto the ball-pad; and molding a compound to form a casing around at least a portion of the die and at least a portion of the solder ball.

16. The method of claim 15 wherein the solder ball is an encased solder ball, and wherein the method further comprises:

grinding the encased solder ball; and depositing an exterior solder ball onto a ground surface of the encased solder ball.

17. The method of claim 15 wherein the microelectronic device is a first microelectronic device, and wherein the method further comprises coupling a second microelectronic device to the solder ball so that the first and second microelectronic devices are stacked.

18. The method of claim 15 wherein the solder ball is an encased solder ball, and wherein the method further comprises depositing an exterior solder ball onto the encased solder ball.

19. The method of claim 15 wherein:

the solder ball is a first solder ball and the ball-pad is a first ball-pad on a first side of the dielectric interposer substrate;

the method further comprises placing a second solder ball onto a second ball-pad on a second side of the dielectric interposer substrate opposite the first side before molding the compound; and molding the compound to form the casing comprises encasing at least a portion of the first and second solder balls with the compound.

20. The method of claim 15 wherein the solder ball is a first solder ball and the ball-pad is a first ball-pad on a first surface of the dielectric interposer substrate, and wherein the method further comprises placing a second solder ball onto a second ball-pad on a second surface before molding the compound.

21. The method of claim 15 wherein molding the compound comprises:

positioning the die, the dielectric interposer substrate, and the solder ball in a mold cavity;

pressing at least a portion of the solder ball into a liner in at least a portion of the mold cavity; and injecting a mold compound into the mold cavity.

22. The method of claim 15 wherein the die has a first end and a second end opposite the first end, and wherein placing the solder ball onto the ball-pad comprises placing the solder ball onto the ball-pad between the first end and the second end of the die.

23. The method of claim 15 wherein the dielectric interposer substrate has an end, and wherein placing the solder ball onto the ball-pad comprises placing the solder ball onto the ball-pad between the die and the end of the dielectric interposer substrate.

24. The method of claim 15, further comprising:

forming a first cover over a first surface of the dielectric interposer substrate with the compound having a first volume; and forming a second cover over a second surface opposite the first surface of the dielectric interposer substrate with the compound having a second volume at least approximately equal to the first volume.

25. The method of claim 15, further comprising:

forming a first cover over a first surface of the dielectric interposer substrate with the compound covering a first surface area; and forming a second cover over a second surface of the dielectric interposer substrate with the compound covering a second surface area at least approximately equal to the first surface area.

26. A method of assembling a microelectronic device having a die and dielectric interposer substrate with a ball-pad, a first surface, and a second surface opposite the first surface, the die being attached to the first or second surface of the dielectric interposer substrate, the method comprising:

placing a solder ball onto the ballad; and encapsulating the die and at least a portion of the first and second surfaces of the dielectric interposer substrate to form a first cover over the first surface and a second cover over the second surface, wherein the first cover has a first volume and the second cover has a second volume at least approximately equal to the first volume.

27. The method of claim 26 wherein placing the solder ball occurs before encapsulating.

28. The method of claim 26 wherein the solder ball is an encased solder ball, and wherein the method further comprises placing an exterior solder ball onto the encased solder ball.

29. The method of claim 26 wherein the solder ball is a first solder ball and the ball-pad is a first ball-pad on the first surface of the dielectric interposer substrate, and wherein the method further comprises placing a second solder ball onto a second ball-pad on the second surface of the dielectric interposer substrate before encapsulating.

30. The method of claim 26 wherein the first cover has a first surface area and the second cover has a second surface area at least approximately equal to the first surface area.

31. A method of assembling a microelectronic device having a die and dielectric interposer substrate with a ball-pad, a first surface, and a second surface opposite the first surface, the die being attached to the first or second surface of the dielectric interposer substrate, the method comprising:

placing a solder ball onto the ball-pad; and encapsulating the die and at least a portion of the first and second surfaces of the dielectric interposer substrate to form a first cover over the first surface and a second cover over the second surface, wherein the first cover has a first surface area and the second cover has a second surface area at least approximately equal to the first surface area.

32. The method of claim 31 wherein placing the solder ball occurs before encapsulating.

33. The method of claim 31 wherein the solder ball is an encased solder ball, and wherein the method further comprises placing an exterior solder ball onto the encased solder ball.

34. The method of claim 31 wherein the solder ball is a first solder, ball and the ball-pad is a first ball-pad on the first surface of the dielectric interposer substrate, and wherein the method further comprises placing a second solder ball onto a second ball-pad on the second surface of the dielectric interposer substrate before encapsulating.

35. The method of claim 31 wherein the first cover has a first volume and the second cover has a second volume at least approximately equal to the first volume.

36. A method of assembling an article, comprising:

attaching a microelectronic die to a first surface of an interposer substrate such that an array of bond-pads on the die is accessible from a second surface of the interposer substrate;

coupling the bond-pads on the die to corresponding terminal pads on the second surface;

placing first solder balls on corresponding ball-pads on the second surface; and forming a first cover over the die and the first surface of the interposer substrate and forming a second cover over the second surface of the interposer substrate, wherein least a portion of the first solder balls is exposed.

37. The method of claim 36, further comprising:

grinding the first solder balls; and depositing exterior solder balls onto corresponding first solder balls.

38. The method of claim 36, further comprising placing exterior solder balls onto the first solder balls.

39. The method of claim 36 wherein placing the first solder balls occurs before forming the first and second covers.

40. The method of claim 36, further comprising placing second solder balls onto ball-pads on the first surface of the interposer substrate before forming the first and second covers.

41. The method of claim 36 wherein forming the first and second covers comprises:

positioning the die, the interposer substrate, and the first solder balls in a mold cavity; and injecting a mold compound into the mold cavity.

42. The method of claim 36 wherein forming the first and second covers comprises:

positioning the die, the interposer substrate, and the first solder balls in a mold cavity;

pressing the first solder balls at least partially into a liner in at least a portion of the mold cavity; and injecting a mold compound into the mold cavity.

43. The method of claim 36 wherein the die has a first end and a second end opposite the first end, and wherein placing the first solder balls comprises placing the first solder balls onto ball-pads between the first end and the second end of the die.

44. The method of claim 36 wherein the interposer substrate has an end, and wherein placing the first solder balls comprises placing the first solder balls onto ball-pads between the die and the end of the interposer substrate.

45. A method of assembling an article, comprising:

attaching a microelectronic die to a first surface of an interposer substrate such that an array of bond-pads on the die is accessible from a second surface of the interposer substrate;

coupling the bond-pads on the die to corresponding terminal pads on the second surface;

placing first solder balls onto ball-pads on the second surface of the interposer substrate;

positioning the die, the interposer substrate, and the first solder balls in a mold cavity after placing the first solder balls; and injecting a molding compound into the mold cavity to encase the die, the first and second surfaces of the interposer substrate, and at least a portion of the first solder balls.

46. The method of claim 45, further comprising depositing exterior solder balls onto the first solder balls.

47. The method of claim 45 wherein injecting the molding compound comprises forming a first cover with a first volume over the first surface of the interposer substrate and forming a second cover with a second volume at least approximately equal to the first volume over the second surface.

48. The method of claim 45 wherein injecting the molding compounding comprises forming a first cover with a first surface area over the first surface of the interposer substrate and forming a second cover with a second surface area at least approximately equal to the first surface area over the second surface.

* * * * *